United States Patent
Oosaki et al.

(10) Patent No.: US 7,080,338 B2
(45) Date of Patent: Jul. 18, 2006

(54) METHOD AND APPARATUS FOR DESIGNING LAYOUT, AND COMPUTER PRODUCT

(75) Inventors: Seiko Oosaki, Kawasaki (JP); Koji Abe, Kawasaki (JP); Hitoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 161 days.

(21) Appl. No.: 10/914,221

(22) Filed: Aug. 10, 2004

(65) Prior Publication Data

US 2005/0235241 A1    Oct. 20, 2005

(30) Foreign Application Priority Data

Apr. 19, 2004   (JP)   ............... 2004-123548

(51) Int. Cl.
G06F 9/45      (2006.01)
G06F 17/50     (2006.01)
G01F 31/28     (2006.01)

(52) U.S. Cl. ........... 716/10; 716/4; 716/6; 716/11; 716/726; 716/727

(58) Field of Classification Search ........... 716/4, 716/6, 10, 11; 714/726–727, 729
See application file for complete search history.

(56) References Cited

U.S. PATENT DOCUMENTS

| | | | |
|---|---|---|---|
| 5,812,561 A * | 9/1998 | Giles et al. ............... | 714/726 |
| 6,071,314 A * | 6/2000 | Baxter et al. ............. | 716/17 |
| 6,226,779 B1 * | 5/2001 | Baxter et al. ............. | 716/16 |
| 6,314,539 B1 * | 11/2001 | Jacobson et al. .......... | 714/727 |
| 2004/0148554 A1 * | 7/2004 | Dervisoglu et al. ...... | 714/727 |
| 2004/0187059 A1 * | 9/2004 | Whetsel ................... | 714/727 |
| 2005/0097416 A1 * | 5/2005 | Plunkett .................. | 714/727 |

FOREIGN PATENT DOCUMENTS

JP    2002-026129    1/2002

* cited by examiner

Primary Examiner—Paul Dinh
Assistant Examiner—Suresh Memula
(74) Attorney, Agent, or Firm—Staas & Halsey LLP (57) ABSTRACT

A layout designing apparatus includes an input unit that receives an input of a frame having a boundary scan register, a placing unit that places an I/O macro to be connected to a signal terminal for propagating other signal than a test signal in an arbitrary I/O macro placement area of the frame input, a determining unit that determines whether a frame terminal at an arbitrary terminal position in the frame matches with at least one of a test terminal for propagating the test signal in the frame input and a signal terminal to be connected to the I/O macro placed, and a replacing unit that replaces, based on a result of determining by the determining unit, the I/O macro placed with either of a shared I/O macro and a test-only I/O macro.

12 Claims, 13 Drawing Sheets

| TERMINAL NUMBER OF FRAME TERMINAL | TERMINAL TYPE | TERMINAL NAME |
|---|---|---|
| 4 | TEST | T1 |
| 1 | TEST | T1 |
| 9 | TEST | T11 |
| 11 | TEST | T12 |
| 12 | CLOCK | C |
| 6 | TEST | T2 |
| 7 | CLOCK | C |
| 10 | TEST | T11 |
| 5 | CLOCK | C |
| ⋮ | ⋮ | ⋮ |

FIG.5

| TERMINAL NUMBER OF FRAME TERMINAL | TERMINAL TYPE | TERMINAL NAME |
|---|---|---|
| 1 | SIGNAL INPUT | SI1 |
| 2 | SIGNAL OUTPUT | SO1 |
| 3 | SIGNAL INPUT | SI2 |
| 4 | SIGNAL INPUT | SI1 |
| 5 | SIGNAL OUTPUT | SO1 |
| 6 | SIGNAL OUTPUT | SO2 |
| 7 | — | — |
| 8 | — | — |
| 9 | — | — |
| 10 | — | — |
| 11 | — | — |
| 12 | — | — |
| ⋮ | ⋮ | ⋮ |

| TEST TERMINAL NAME | SIGNAL TERMINAL NAME | SHARED I/O MACRO |
|---|---|---|
| T1 | SI1 |  C1, A1, B1→ |
| T2 | SO2 |  C2, A2, B2→ |
| ⋮ | ⋮ | ⋮ |

FIG.7

| TEST TERMINAL NAME | EXTERNAL TERMINAL I/O ATTRIBUTE | TEST DEDICATED I/O MACRO INFORMATION ||
|---|---|---|---|
| | | TEST DEDICATED I/O CELL | TEST DEDICATED BSR |
| T11 | INPUT |  |  |
| T12 | OUTPUT |  |  |
| ⋮ | ⋮ | ⋮ | ⋮ |

METHOD AND APPARATUS FOR DESIGNING LAYOUT, AND COMPUTER PRODUCT

CROSS-REFERENCE TO RELATED APPLICATIONS

This application is based upon and claims the benefit of priority from the prior Japanese Patent Application No.2004-123548, filed on Apr. 19, 2004, the entire contents of which are incorporated herein by reference.

BACKGROUND OF THE INVENTION

1) Field of the Invention

The present invention relates to a method and an apparatus for designing a layout for large scale integrated (LSI) chips having a boundary scan register, and a computer product.

2) Description of the Related Art

Conventionally, a boundary scan register is not placed beforehand on an LSI chip, but is placed adjacent to either of an input/output (I/O) cell and a functional core cell, based on a wiring status with the I/O cell or the functional core cell through which a signal propagates (see, for example, Japanese Patent Application Laid-open No. 2002-26129).

However, since the boundary scan register should be built in a circuit of input data at the time of layout designing, it is necessary to insert the boundary scan register using a test synthesis tool before the layout designing.

When inserting the boundary scan register, the boundary scan register is placed adjacent to either of the I/O cell and the functional core cell based on the wiring status with the I/O cell or the functional core cell, so as to shorten the wiring, to prevent degradation of the circuit from the signal propagation, such as a timing error due to wiring delay. Therefore, since it is necessary to strictly extract a placement area of the boundary scan register, much time is required until the boundary scan register can be placed at an optimum position, resulting in a long time to design the layout.

SUMMARY OF THE INVENTION

It is an object of the present invention to solve at least the above problems in the conventional technology.

The layout designing apparatus according to one aspect of the present invention includes an input unit that receives an input of a frame having a boundary scan register that propagates a test signal to an I/O macro placement area, a placing unit that places an I/O macro to be connected to a signal terminal for propagating other signal than the test signal in an arbitrary I/O macro placement area of the frame input, a determining unit that determines whether a frame terminal at an arbitrary terminal position in the frame matches with at least one of a test terminal for propagating the test signal in the frame input and a signal terminal to be connected to the I/O macro placed, and a replacing unit that replaces, based on a result of determining by the determining unit, the I/O macro placed with either of a shared I/O macro to be connected to a shared terminal for propagating the test signal and the other signal and a test-only I/O macro propagating the test signal and having the boundary scan register.

The layout designing method according to another aspect of the present invention includes receiving an input of a frame having a boundary scan register that propagates a test signal to an I/O macro placement area, placing an I/O macro to be connected to a signal terminal for propagating other signal than the test signal in an arbitrary I/O macro placement area of the frame input, determining whether a frame terminal at an arbitrary terminal position in the frame matches with at least one of a test terminal for propagating the test signal in the frame input and a signal terminal to be connected to the I/O macro placed, and replacing, based on a result of determining by the determining unit, the I/O macro placed with either of a shared I/O macro to be connected to a shared terminal for propagating the test signal and the other signal and a test-only I/O macro propagating the test signal and having the boundary scan register.

The other objects, features, and advantages of the present invention are specifically set forth in or will become apparent from the following detailed description of the invention when read in conjunction with the accompanying drawings.

DETAILED DESCRIPTION

Exemplary embodiments of a method and an apparatus for designing a layout for LSI chips, and a computer product according to the present invention will be explained below in detail with reference to the accompanying drawings.

Figure 1:
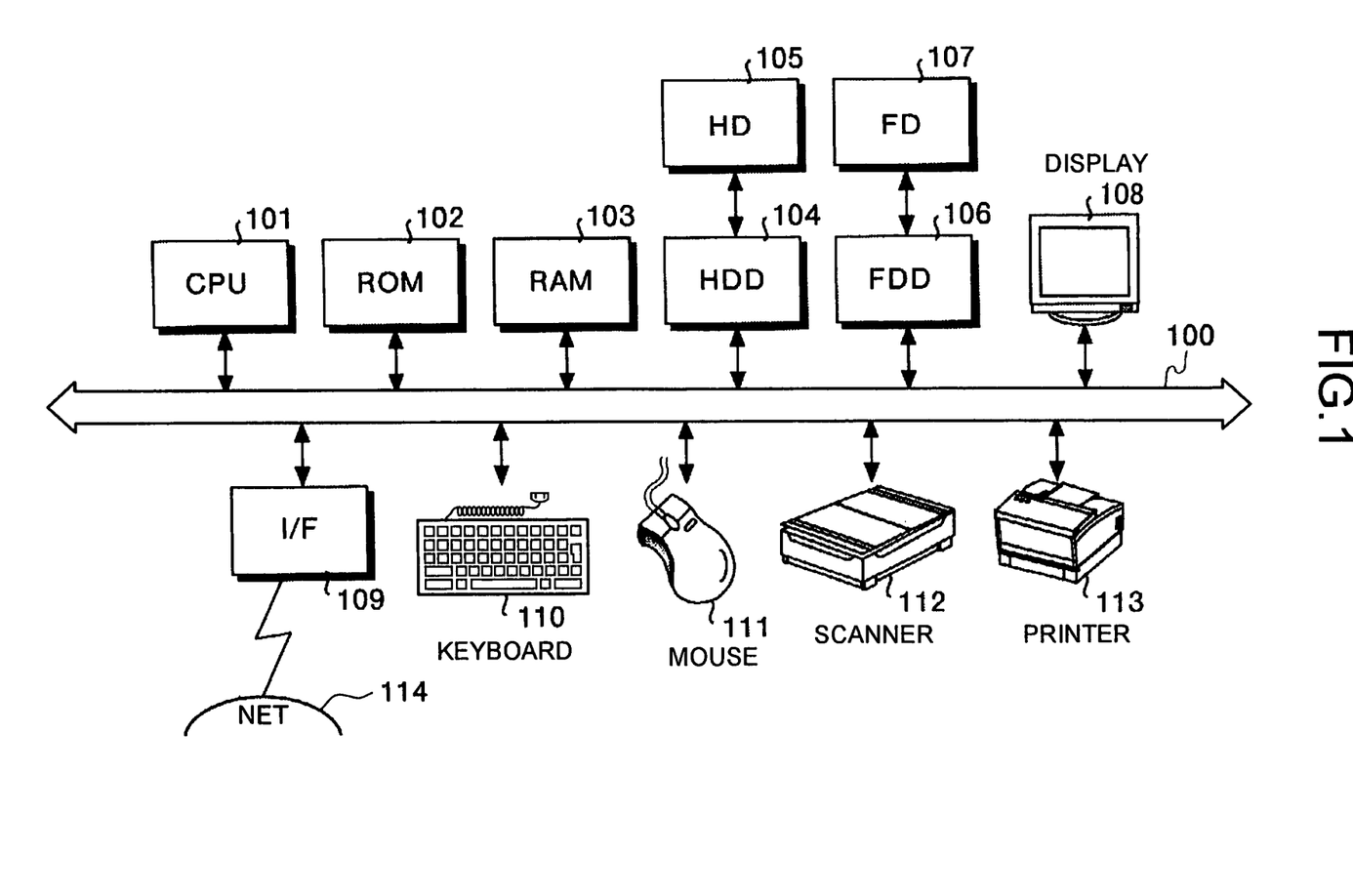
FIG. 1 is a schematic for illustrating a hardware configuration of a layout designing apparatus according to an embodiment of the present invention.

FIG. 1 is a schematic for illustrating a hardware configuration of a layout designing apparatus according to an embodiment of the present invention.

The layout designing apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. The respective components are interconnected via a bus 100.

The CPU 101 controls the entire operation of the layout designing apparatus. The ROM 102 stores therein programs such as a boot program. The RAM 103 is used as a work area for the CPU 101. The HDD 104 controls the data read/write operation of the HD 105, under the control of the CPU 101. The HD 105 stores the written data under the control of the HDD 104.

The FDD 106 controls the data read/write operation of the FD 107 under the control of the CPU 101. The FD 107 stores the data written under the control of the FDD 106, and allows the layout designing apparatus to read the data stored in the FD 107.

The removable recording medium is not limited specifically to the FD 107, but may also be a CD-ROM (CD-R, CD-RW), a magneto optical (MO), a digital versatile disk (DVD), or a memory card. The display 108 displays data such as a document, an image, and functional information, including a cursor, icons, or a toolbox. The display 108 may be, for example, a cathode ray tube (CRT), a thin film transistor (TFT) liquid crystal display, or plasma display.

The I/F 109 is connected via a communication line to a network 114 such as the Internet, through which it is connected to other devices. The I/F 109 provides the interface between the network 114 and the layout designing apparatus, and controls the input and output of data of an external device. For example, a modem or a LAN adapter may be employed as the I/F 109.

The keyboard 110 is provided with keys for inputting characters, numerals, and various instructions or commands. The keyboard 110 may be replaced with a touch panel type input pad or a numeric keypad. The mouse 111 is to move the cursor or specify the range of its movement, or scroll the window or change the window size. In this case, a track ball or a joystick may be used as long as it has the same functions as a pointing device.

The scanner 112 reads an image optically, and captures image data into the layout designing apparatus. The scanner 112 may also have an optical character reader (OCR) function. The printer 113 prints image data and document data. The printer 113 may be a laser printer or an ink jet printer, for instance.

Figure 2:
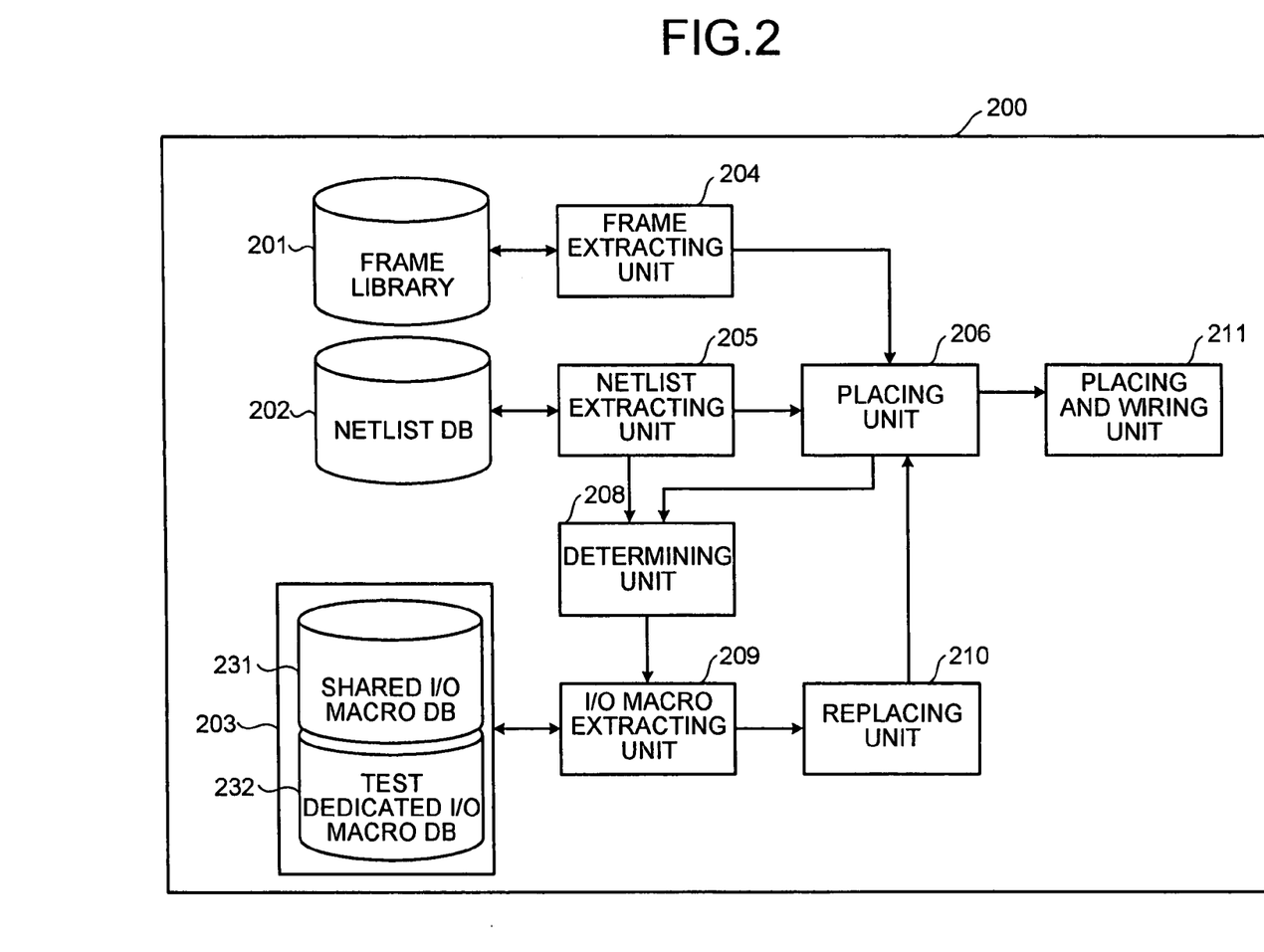
FIG. 2 is a schematic for illustrating a functional configuration of the layout designing apparatus according to the embodiment.

FIG. 2 is a schematic for illustrating a functional configuration of the layout designing apparatus according to the embodiment.

The layout designing apparatus 200 includes a frame library 201, a netlist database 202, an I/O macro database 203, a frame extracting unit 204, a netlist extracting unit 205, a placing unit 206, a determining unit 208, an I/O macro extracting unit 209, a replacing unit 210, and a placing and wiring unit 211.

The frame library 201 stores frames having various kinds of Internet protocol (IP) macros as represented by the boundary scan register, and the placement and wiring information such as the terminal positions of the IP macros, rotation codes, placed positions, and wiring routes stored therein. A plurality of frames is prepared according to the LSI chips to be designed.

Figure 3:
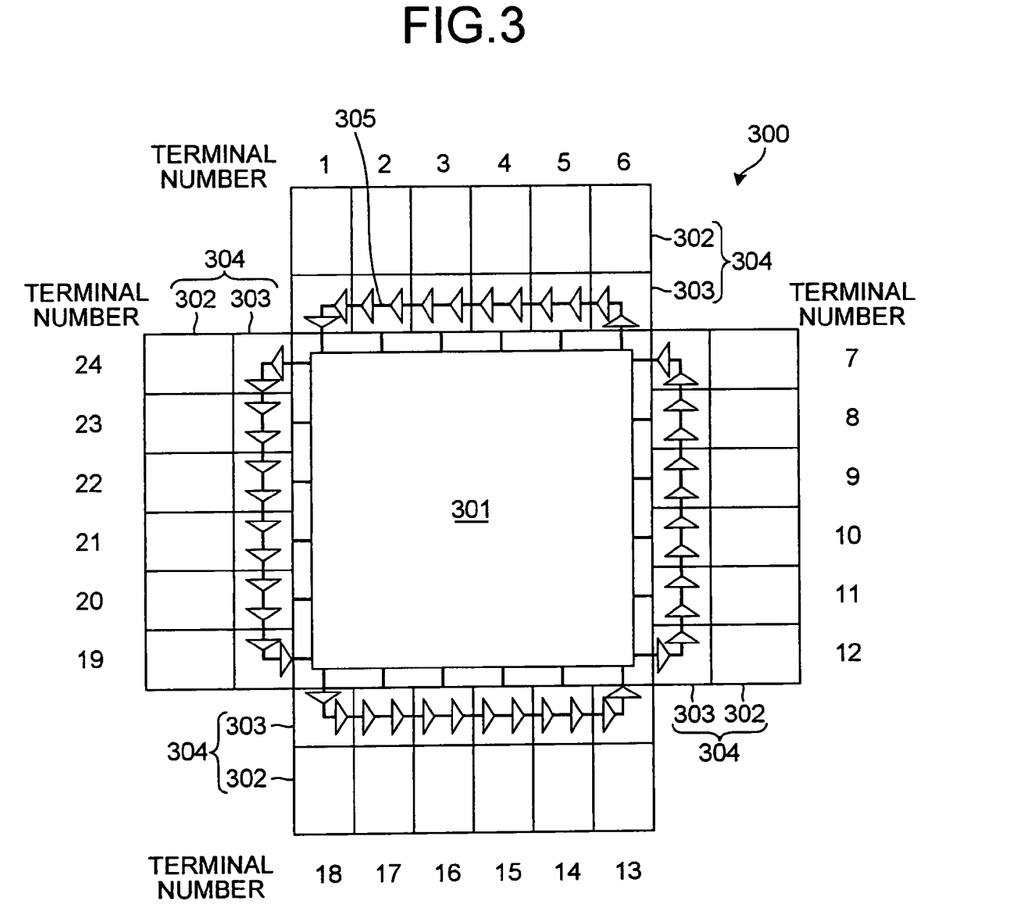
FIG. 3 is a schematic for explaining an example of a frame stored in a frame library.

One specific example of the frame will be explained below. FIG. 3 is a schematic for explaining an example of a frame stored in a frame library 201. A frame 300 has a substrate circuit unit 301 of an LSI, referred to as a master, and an I/O macro placement area 304 formed of an I/O cell placement area 302 and a boundary scan register placement area 303, around the substrate circuit unit 301. The figures described outside of the I/O macro placement area 304 express terminal numbers of a frame terminal Pi (not shown in FIG. 3) for connecting the I/O macro placement area 304 to the outside.

A main IP macro and wiring layers (not shown) are embedded in the substrate circuit unit 301, so that the operation speed and the performance of various functions are ensured. Three basic wiring layers of all six wiring layers are shared, and only the remaining three customized wiring layers can be layout-designed (customized) according to the user's specification.

A clock supply circuit of eight systems with a phase-locked loop (PLL) circuit is prepared in the basic wiring layers. In order to ensure signal transmission, it is designed considering wiring placement against noise, and delay variation effect with respect to timing calculation. Since a SCAN circuit and a BIST circuit that can simplify product tests have been already designed, the load on the test synthesis work and timing design relating to testing can be considerably reduced. Further, a boundary scan register 305, which becomes the main IP macro, is embedded in each boundary scan register placement area 303.

In the embodiment, not all IP macros prepared on the frame 300 are used for the layout design, but the I/O macro to be used for the layout design is determined depending on which frame terminal Pi is to be used according to the user's netlist.

Figure 4:
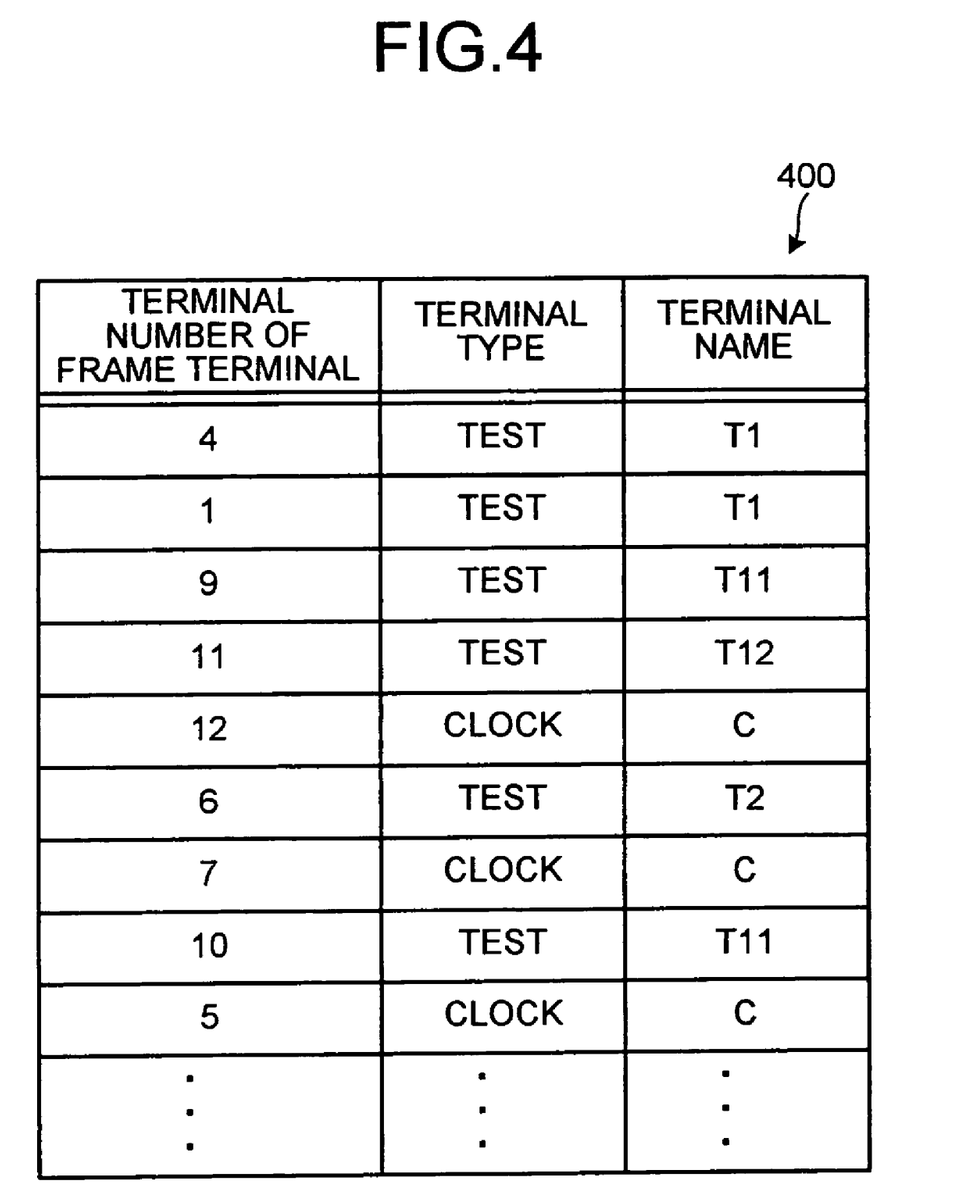
FIG. 4 is a table of an example of a frame information file.

Frame information files are stored in the frame library 201. FIG. 4 is a table of an example of a frame information file. The frame information file 400 includes terminal number, terminal type, and terminal name of the frame terminal Pi. The "terminal type" indicates whether the frame terminal Pi indicated by the terminal number i is a test terminal or a clock terminal. The "terminal name" indicates the terminal name corresponding to the terminal type. As the test terminal name, there are T1, T2, . . . , T11, T12, . . . , and these are respectively different test terminals. The clock terminal name is C only.

Figure 8:
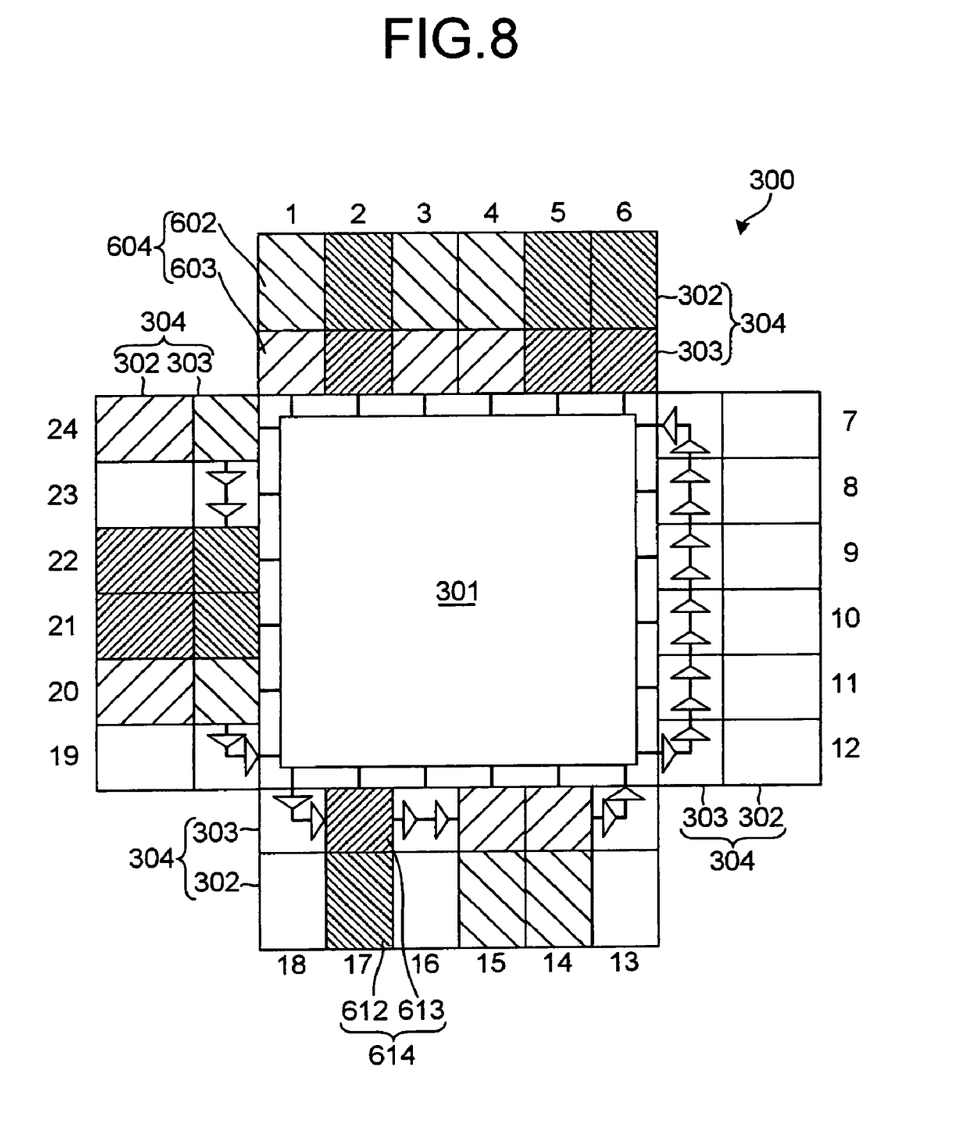
FIG. 8 is a schematic for illustrating a frame in which a representative I/O macro is placed by a placing unit.

The netlist database 202, shown in FIG. 2, stores a netlist indicating the connection information of a circuit designed by a user. Specifically, the netlist includes an I/O macro for propagating signals (excluding a test signal) from/to the outside (hereinafter, as "representative I/O macro"). The representative I/O macro includes a representative input I/O macro 604 formed of a representative input I/O cell 602 and a representative input boundary scan register 603, and a representative output I/O macro 614 formed of a representative output I/O cell 612 and a representative output boundary scan register 613, as shown in FIG. 8 described later.

Figure 5:
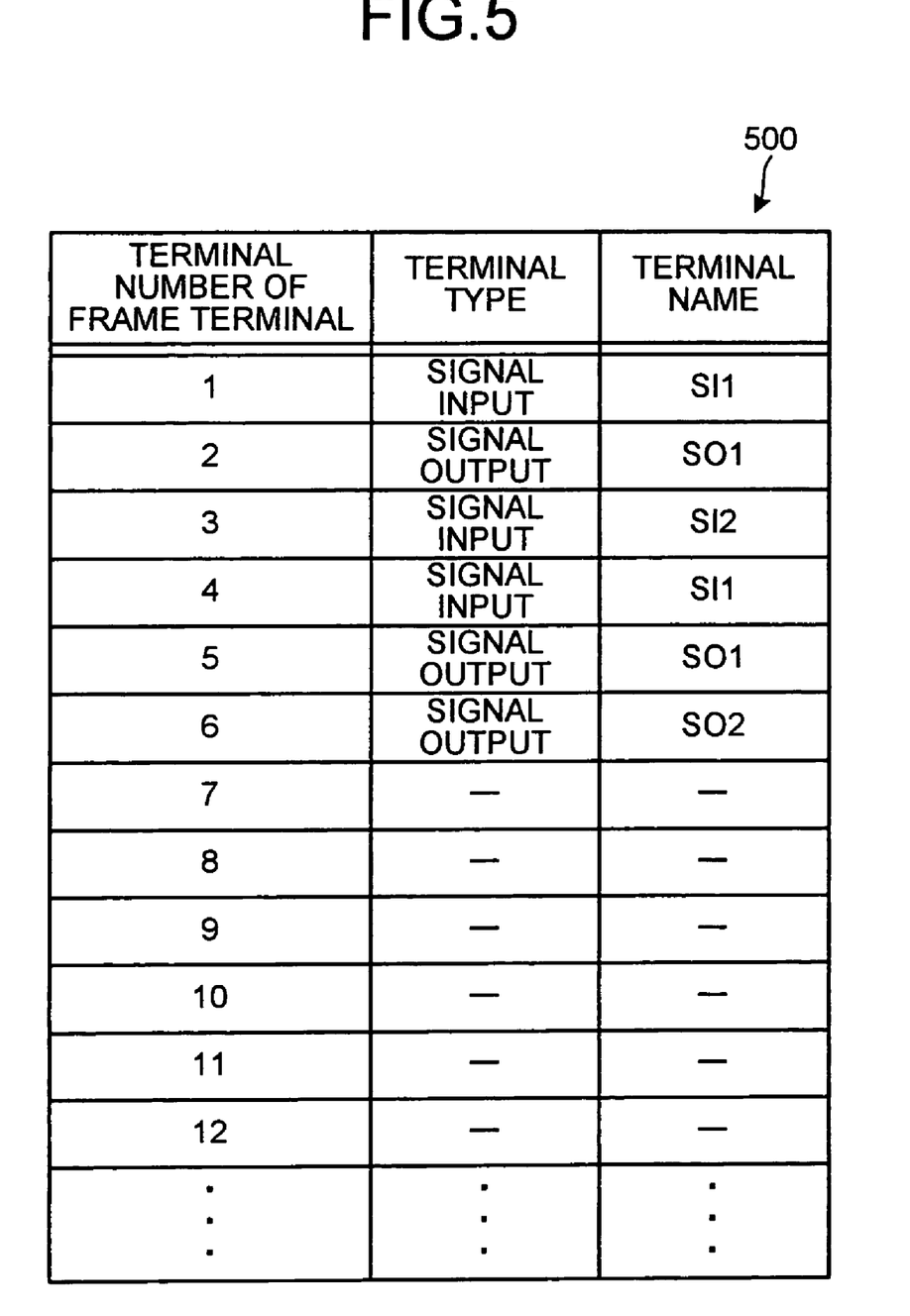
FIG. 5 is a table of an example of a netlist information file.

Further, netlist information files are stored in the netlist database 202. FIG. 5 is a table of an example of a netlist information file. The netlist information file 500 includes terminal number, terminal type, and terminal name of the frame terminal Pi. The "terminal type" indicates whether the frame terminal Pi indicated by the terminal number i is a signal input terminal or a signal output terminal. The "terminal name" indicates the terminal name corresponding to the terminal type. For example, there are S11, S12, . . . for the signal input terminals, and there are S01, S02, . . . for the signal output terminals.

Figure 6:
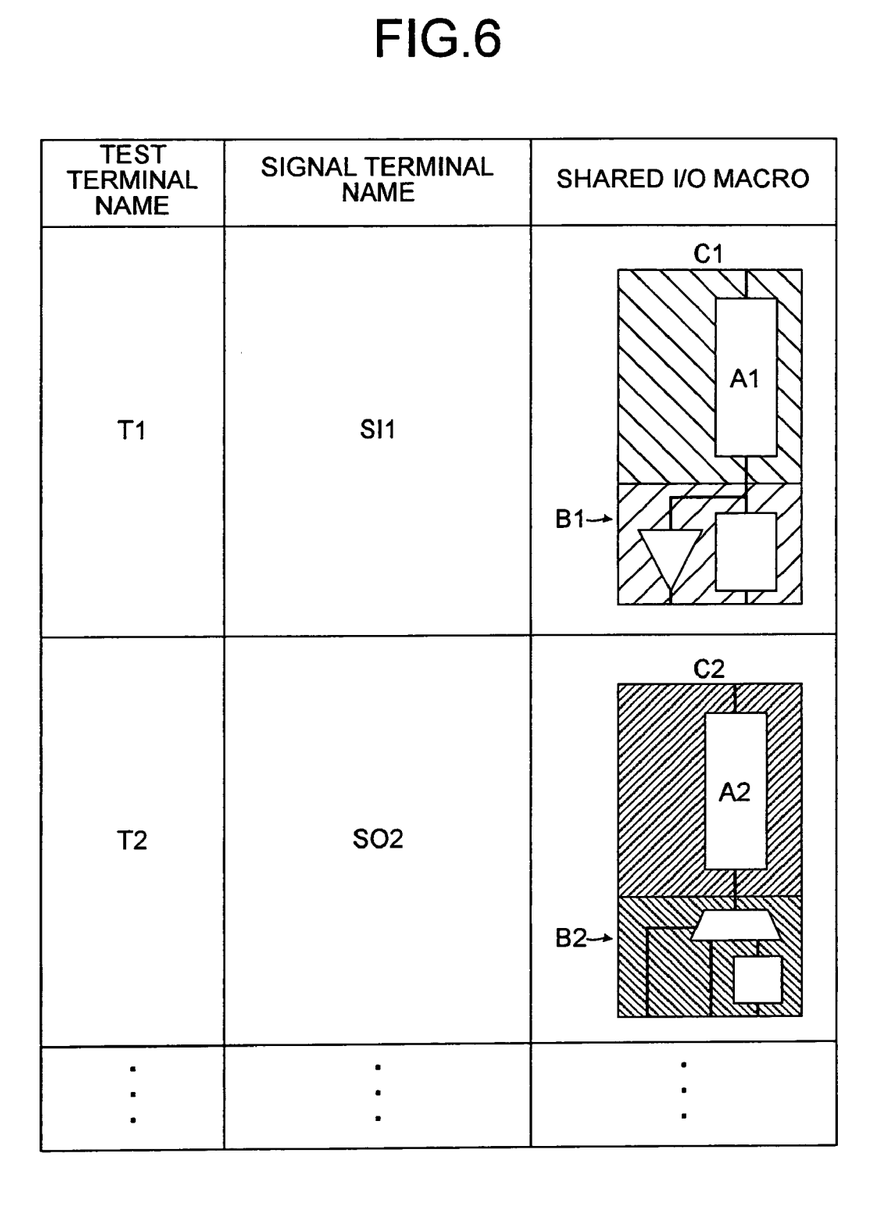
FIG. 6 is a schematic for explaining contents stored in a shared I/O macro database.

The I/O macro database 203 has a shared I/O macro database 231 and a test-only I/O macro database 232. FIG. 6 is a schematic for explaining contents stored in a shared I/O macro database 231. A shared I/O macro is specified from the shared I/O macro database 231, based on a synthesis of the test terminal and the signal terminal. The shared I/O macro is an I/O macro placed in the I/O macro placement area 304, when the frame terminal Pi is compatible with the test terminal for propagating the test signal and the signal terminal for propagating other signals other than the test signal.

For example, when an arbitrary frame terminal Pi becomes a shared terminal having both functions of the test terminal T1 and the signal input terminal S11, a shared I/O macro C1 is selected. A shared I/O cell A1 in the shared I/O macro C1 is the same as the representative output I/O cell 602, but a shared boundary scan register B1 is different from the representative boundary scan register 603, and is a boundary scan register that can input the test signal and signals other than the test signal, for example, a control signal or a data signal.

Likewise, when an arbitrary frame terminal Pi becomes a shared terminal having both functions of the test terminal T2 and the signal output terminal S02, a shared I/O macro C2 is selected. A shared I/O cell A2 in the shared I/O macro C2 is the same as the representative output I/O cell 612, but a shared boundary scan register B2 is different from the representative boundary scan register 613, and is a boundary scan register that can output the test signal and signals other than the test signal.

Figure 7:
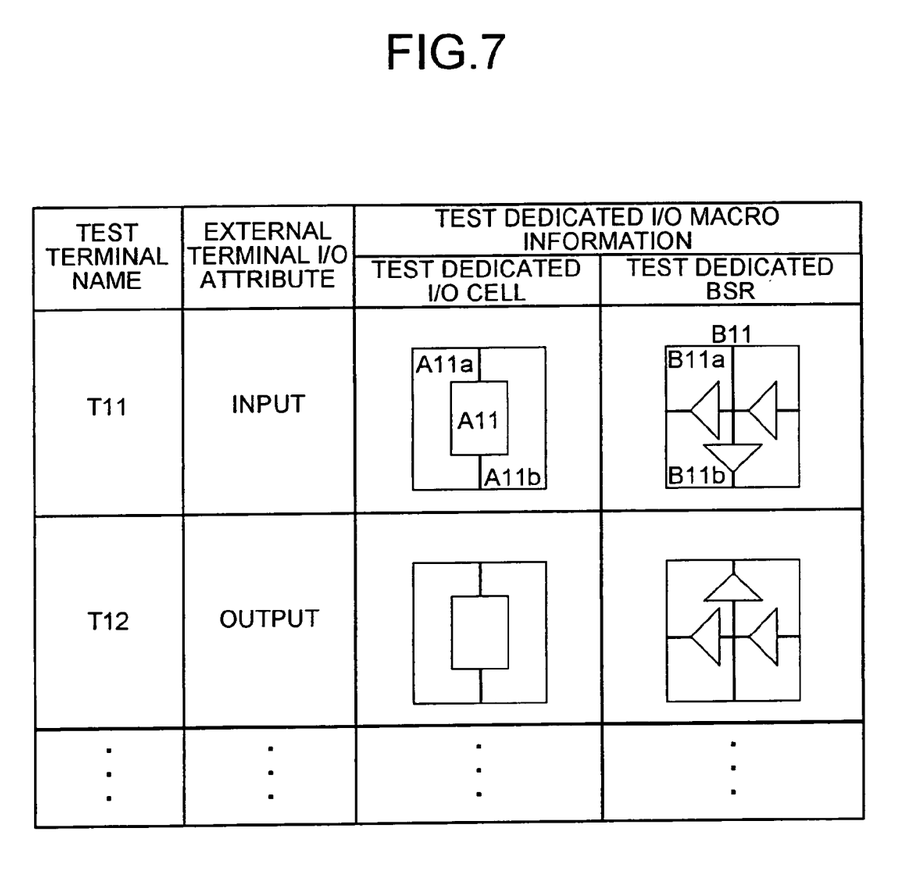
FIG. 7 is a schematic for explaining contents stored in a test-only I/O macro database.

FIG. 7 is a schematic for explaining contents stored in a test-only I/O macro database 232. Input and output attributes of an external terminal and a test-only I/O macro are stored for each test terminal. The test-only I/O macro stands for an I/O macro that propagates only test signals between the frame terminal and the external terminal, and has the boundary scan register.

The test-only I/O macro has a test only I/O cell and a test dedicated boundary scan register (BSR). The test only I/O cell has a connection terminal connected to the external terminal and the test dedicated boundary scan register. The test dedicated boundary scan register has a connection terminal connected to the test only I/O cell.

For example, in the test terminal T11, the test only I/O cell A11 has a connection terminal A11a connected to the external terminal, and a connection terminal A11b connected to the test dedicated boundary scan register B11. The test dedicated boundary scan register B11 has a connection terminal B11a connected to the test only I/O cell A11.

The frame library 201, the netlist database 202, and the I/O macro database 203 realize the functions thereof by a recording medium, such as the ROM 102, the RAM 103, the HD 105, or the FD 107 shown in FIG. 1. The frame library 201, the netlist database 202, and the I/O macro database 203 may be provided in an external server that can be obtained via the network 114 shown in FIG. 1.

The frame extracting unit 204, shown in FIG. 2, extracts a frame 300 and a frame information file 400. Specifically, the frame extracting unit 204 extracts a frame 300 and a frame information file 400 fitted for the netlist of a user who has issued a design request, by operating the keyboard 110 and the mouse 111 shown in FIG. 1. The netlist extracting unit 205 extracts a netlist and a netlist information file 500 from the netlist database 202. Specifically, a representative I/O macro and a netlist information file 500 included in the netlist of the user who has issued the design request, by operating the keyboard 110 and the mouse 111 shown in FIG. 1.

The placing unit 206 places the representative I/O macro indicating the netlist extracted by the netlist extracting unit 205 in the frame 300 extracted by the frame extracting unit 204, based on the frame information file 400 extracted by the frame extracting unit 204, and the netlist information file 500 extracted by the netlist extracting unit 205. Specifically, the placing unit 206 places the representative I/O macro in the I/O macro placement area 304 in the frame 300, by operating the keyboard 110 and the mouse 111 shown in FIG. 1. The boundary scan register recorded beforehand in the frame 300 is replaced by a representative boundary scan register included in the representative I/O macro. Further, when the I/O macro area to be placed has been already described in the netlist, the representative I/O macro may be automatically placed.

FIG. 8 is a schematic for illustrating a frame in which a representative I/O macro is placed by a placing unit 206. Representative I/O macros 604 and 614 are respectively placed in the I/O macro placement areas 304, connectable to frame terminals P1 to P6, P14, P15, P17, P20 to P22, and P24 of the terminal numbers 1 to 6, 14, 15, 17, 20 to 22, and 24.

Specifically, the representative I/O macro 604 having the representative input I/O cell 602 and the representative input boundary scan register 603 is respectively placed in the I/O macro placement areas 304 connectable to the frame terminals P1, P3, P4, P14, P15, P20, and P24 of the terminal numbers 1, 3, 4, 14, 15, 20, and 24. Further, the representative output I/O macro 614 having the representative output I/O cell 612 and the representative output boundary scan register 613 is respectively placed in the I/O macro placement areas 304 connectable to the frame terminals P2, P5, P6, P17, P21, and P22 of the terminal numbers 2, 5, 6, 17, 21, and 22.

Figure 9:
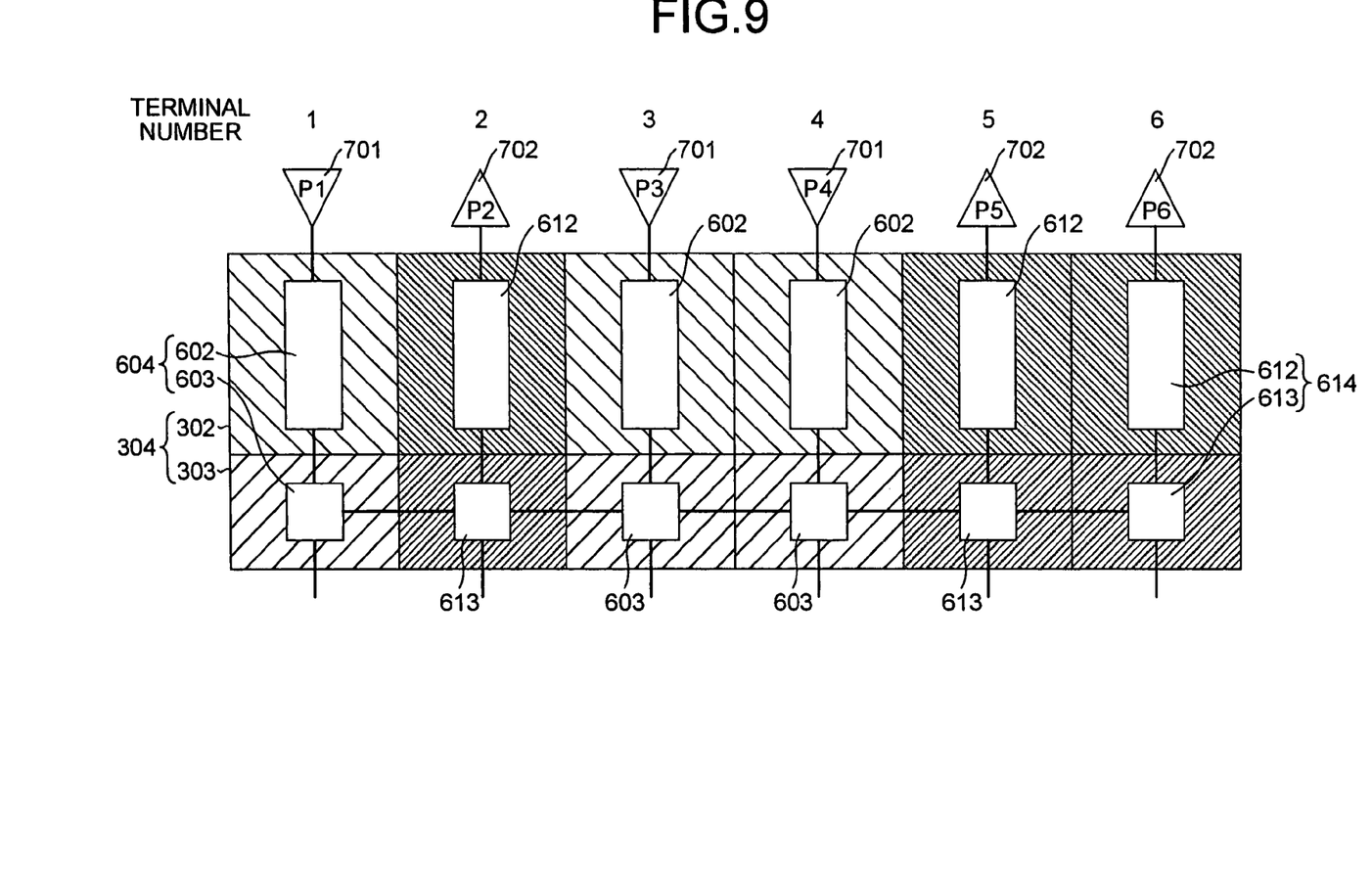
FIG. 9 is an enlarged view of an I/O macro placement area connectable to frame terminals 1 to 6 shown in FIG. 8.

FIG. 9 is an enlarged view of an I/O macro placement area connectable to frame terminals 1 to 6 shown in FIG. 8. The frame terminals P1, P3, and P4 of the terminal numbers 1, 3, and 4 are external input terminals 701 connected to the representative input I/O cell 602. Further, the frame terminals P2, P5, and P6 of the terminal numbers 2, 5, and 6 are external input terminals 702 connected to the representative output I/O cell 612.

Figure 10:
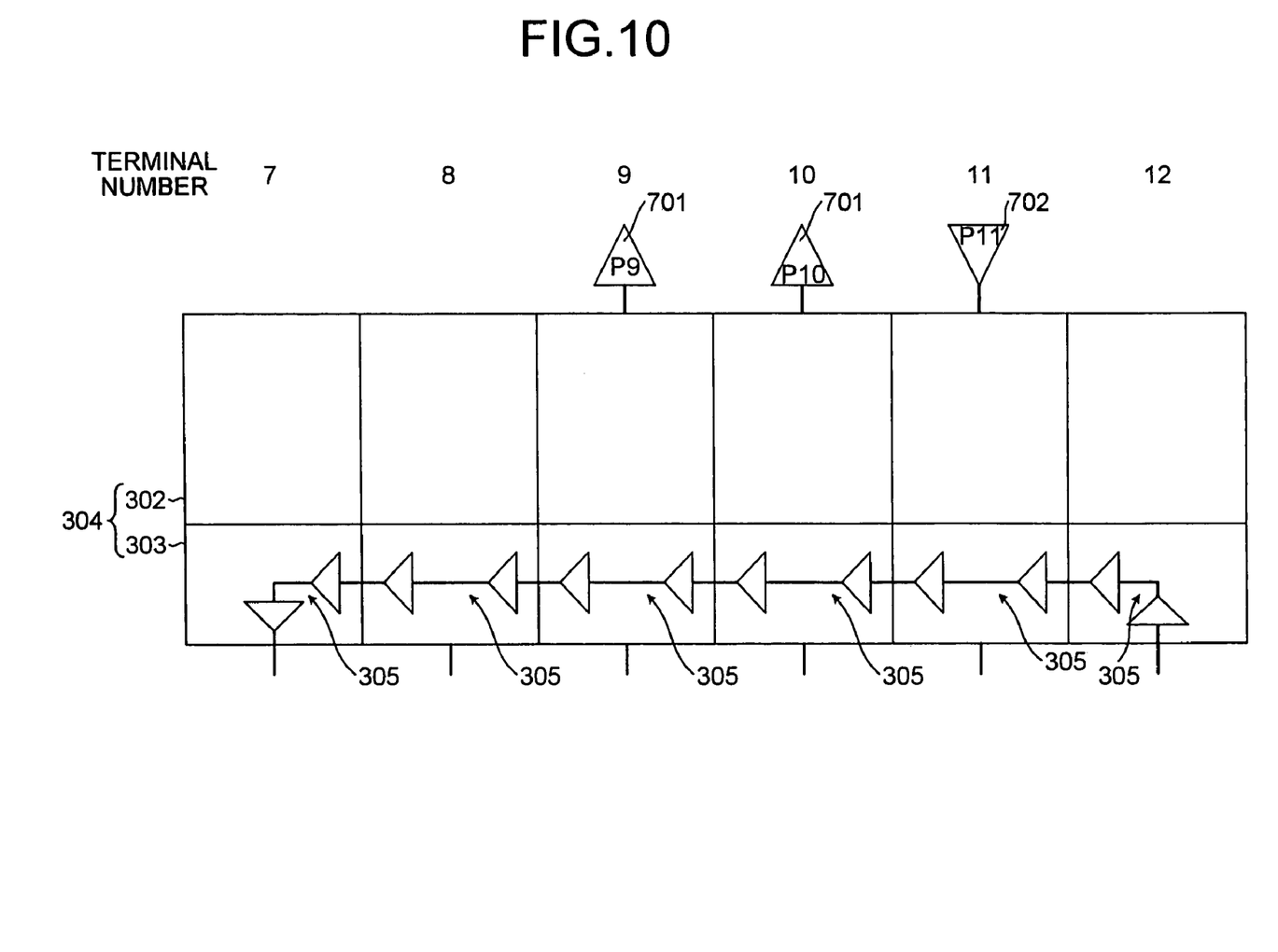
FIG. 10 is an enlarged view of an I/O macro placement area connectable to frame terminals 7 to 12 shown in FIG. 8.

FIG. 10 is an enlarged view of an I/O macro placement area connectable to frame terminals 7 to 12 shown in FIG. 8. The I/O cell placement areas 302 at terminal numbers 7 to 12 are unused areas, and a boundary scan register 305 stored beforehand in the frame 300 is placed respectively in the boundary scan register placement area 303.

The determining unit 208, shown in FIG. 2, determines whether the frame terminal Pi indicated by the terminal number i is in agreement with any one of the test terminal and the signal terminal connected to the I/O macro placed by the placing unit 206 or both. This determination is performed based on the frame information file 400 and the netlist information file 500.

For example, referring to the frame information file 400 shown in FIG. 4, it is seen that the frame terminal P1 of the terminal number "1" is a test terminal T1. Likewise, referring to the netlist information file 500 shown in FIG. 5, it is seen that the frame terminal P1 of the terminal number "1" is a signal input terminal S11. Therefore, it is determined that the frame terminal P1 of the terminal number "1" is a shared terminal for the test terminal T1 and the signal input terminal S11.

Referring to the frame information file 400 shown in FIG. 4, it is seen that the frame terminal P9 of the terminal number "9" is a test terminal T11. On the other hand, referring to the netlist information file 500 shown in FIG. 5, it is seen that the frame terminal P9 of the terminal number "9" is not a signal terminal. Therefore, it is determined that the frame terminal P9 of the terminal number "9" is a test dedicated terminal.

The I/O macro extracting unit 209 extracts a test-only I/O macro propagating the test signal and having a boundary scan register, or a shared I/O macro connected to a shared terminal for propagating a test signal and other signals, from the I/O macro database 203 based on the terminal in agreement with the frame terminal Pi determined by the determining unit 208.

For example, when explaining the frame terminal P1 of the terminal number "1" as an example, the frame terminal P1 is a shared terminal for the test terminal T1 and the signal input terminal S11. Therefore, the shared I/O macro C1 is extracted from the shared I/O macro database 231, based on the "test terminal name" and the "signal terminal name" in the shared I/O macro database 231.

Likewise, when explaining the frame terminal P9 of the terminal number "9" as an example, the frame terminal P9 is a test dedicated terminal functioning independently for the test terminal T11. Therefore, a test-only I/O macro (the test only I/O cell A11 and the test dedicated boundary scan register B11) is extracted from the test-only I/O macro database 232, based on the "test terminal name" in the test-only I/O macro database 232.

Figure 11:
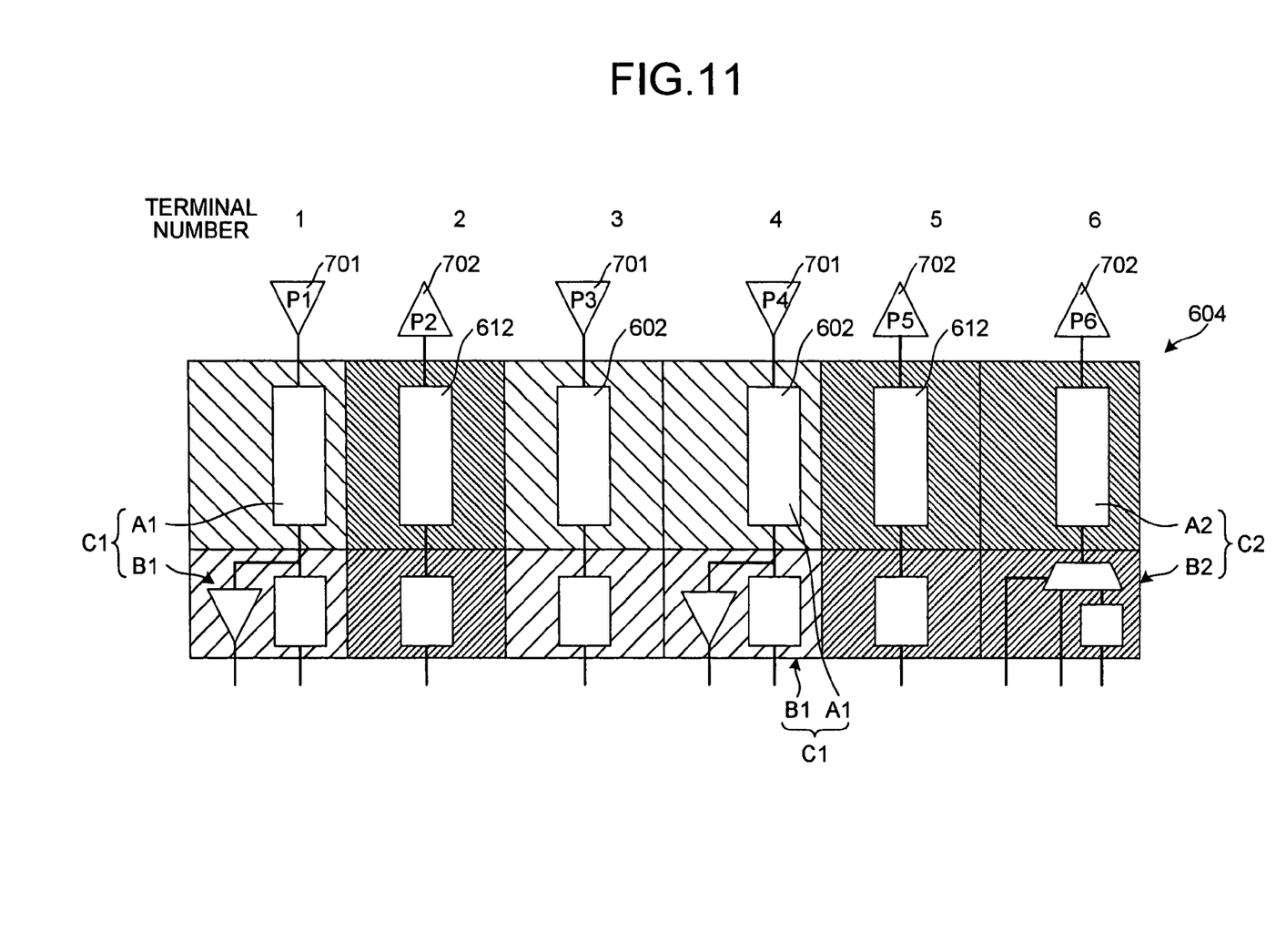
FIG. 11 is an enlarged view of an I/O macro placement area in which a representative I/O macro is replaced by a shared I/O macro shown in FIG. 9.

The replacing unit 210 replaces the I/O macro extracted by the I/O macro extracting unit 209 for the representative I/O macro placed by the placing unit 206. The replacement processing by the replacing unit 210 will be specifically explained. FIG. 11 is an enlarged view of an I/O macro placement area in which a representative I/O macro is replaced by a shared I/O macro shown in FIG. 9. When explaining the representative input I/O macro 604 relating to the frame terminal P1 of the terminal number "1" shown in FIG. 11 as an example, the representative input I/O macro 604 is replaced by the shared I/O macro C1 extracted from the shared I/O macro database 231.

Figure 12:
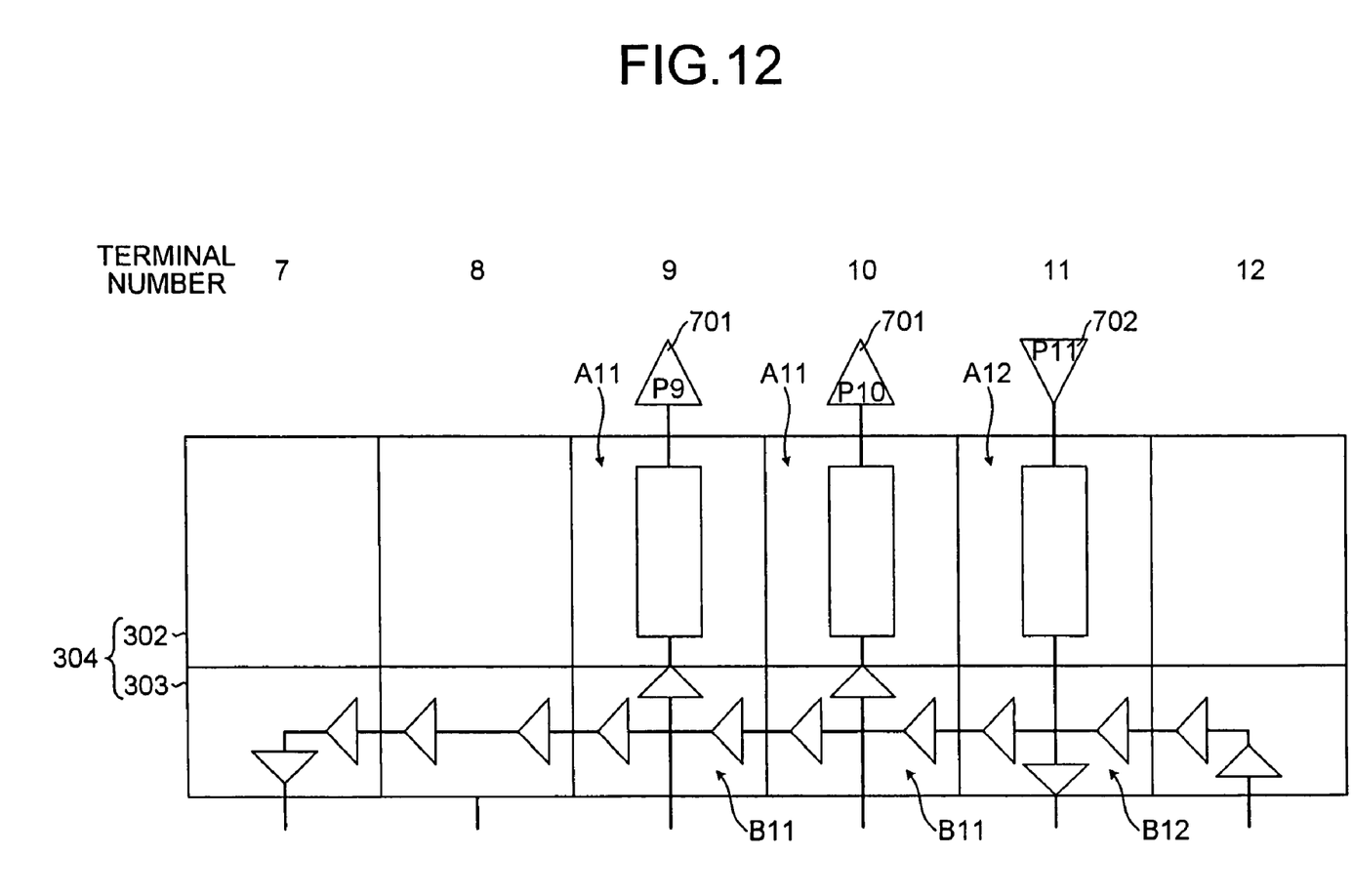
FIG. 12 is an enlarged view of an I/O macro placement area in which a representative I/O macro is replaced by a test-only I/O macro shown in FIG. 10.

FIG. 12 is an enlarged view of an I/O macro placement area in which a representative I/O macro is replaced by a test-only I/O macro shown in FIG. 10. When explaining the I/O macro placement area 304 relating to the frame terminal P9 of the terminal number "9" shown in FIG. 10 as an example, before the replacement, as shown in FIG. 10, an I/O cell is not placed in the I/O cell placement area 302. On the other hand, the boundary scan register 305 embedded in the frame 300 beforehand is placed in the boundary scan register placement area 303 relating to the frame terminal P9.

Since the frame terminal P9 is a test dedicated terminal formed of only the test terminal T11, the test only I/O cell A11 extracted from the test-only I/O macro database 232 in FIG. 12 is placed in the I/O cell placement area 302 relating to the frame terminal P9, by the replacement processing. Further, in the boundary scan register placement area 303 relating to the frame terminal P9, the boundary scan register 305 embedded in the frame 300 is replaced by the test dedicated boundary scan register B11 extracted from the test-only I/O macro database 232.

The placing and wiring unit 211 automatically places other necessary circuits in the frame in which the replacement processing is performed by the replacing unit 210, and performs automatic wiring by using an automatic placing and wiring tool. The respective functional units 204 to 211 realize the functions thereof by the CPU 101 executing the program stored in the ROM 102, the RAM 103, the HD 105, or the FD 107 shown in FIG. 1, or by the I/F 109.

Figure 13:
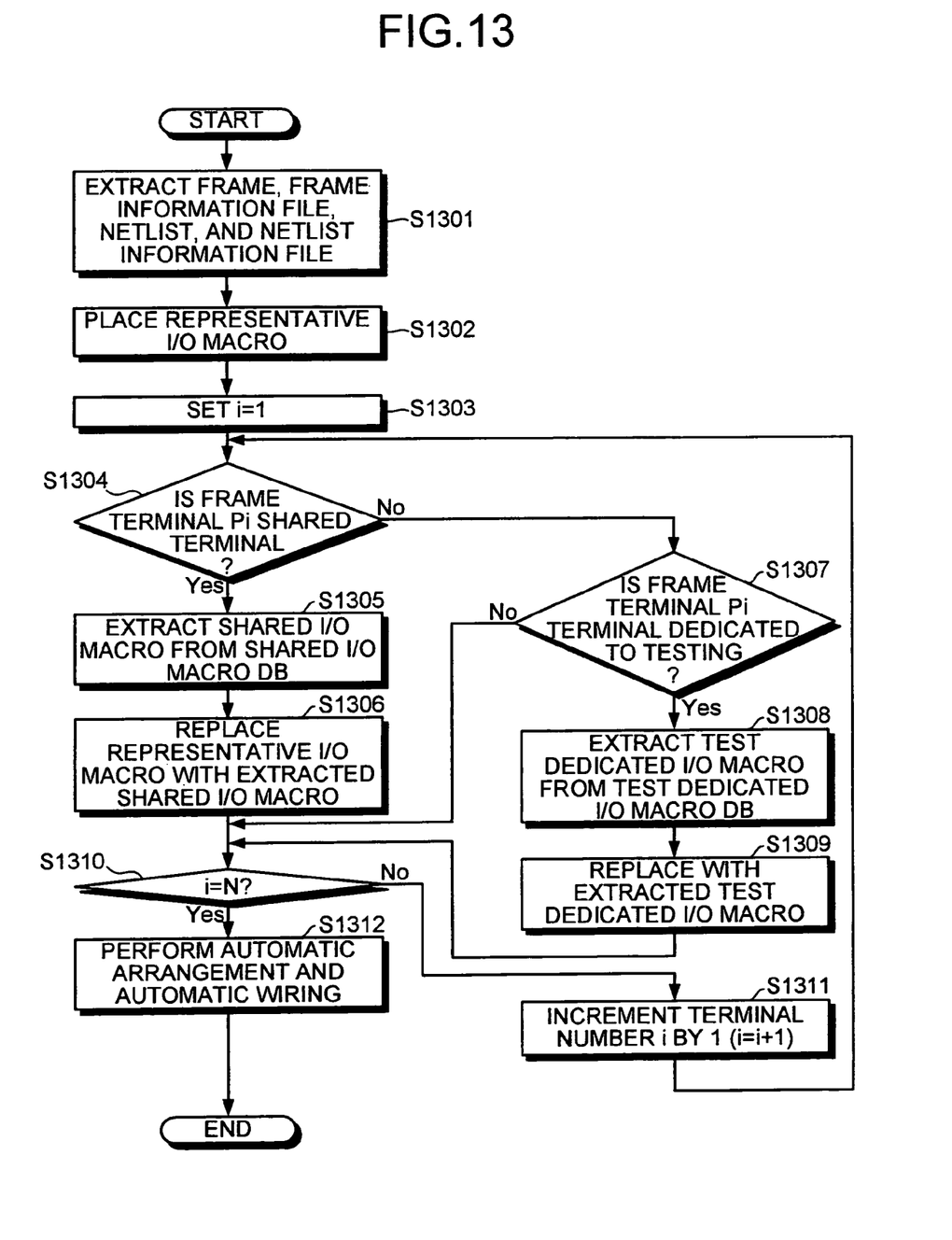
FIG. 13 is a flowchart of a process procedure for layout designing according to the embodiment.

FIG. 13 is a flowchart of a process procedure for layout designing according to the embodiment. At first, the frame 300, the frame information file 400, the netlist, and the netlist information file 500 shown in FIG. 3 (step S1301) are extracted. A representative I/O macro is then placed in the frame 300 (step S1302). The frame at this time is the frame 300 shown in FIG. 8.

A terminal number i is then designated as i=1 (step S1303). The step is followed by determining whether the frame terminal Pi is a shared terminal having a function of the test terminal and a function of the signal terminal, based on the frame information file 400 and the netlist information file 500 (step S1304).

When it is determined that the frame terminal Pi is a shared terminal (step S1304: Yes), a shared I/O macro that agrees with the test terminal name and the signal terminal name of the shared terminal is extracted, from the shared I/O macro database 231 (step S1305). The representative I/O macro connected to the frame terminal Pi of the terminal number i is replaced with the extracted shared I/O macro (step S1306).

On the other hand, when it is determined that the frame terminal Pi is not a shared terminal (step S1304: No), a subsequent determination is made whether the frame terminal Pi is a test dedicated terminal having only a test terminal (step S1307). When it is determined that the frame terminal Pi is a test dedicated terminal (step S1307: Yes), a test-only I/O macro, with a terminal name matching with the test terminal name from the test-only I/O macro database 232 (step S1308), is extracted.

Subsequently, the extracted test-only I/O macro is placed in the I/O macro placement area I/O macro placement area 304 relating to the frame terminal Pi of the terminal number i (step S1309). Accordingly, the test only I/O cell can be placed in an unused I/O cell placement area 302, and the boundary scan register 305 embedded in the frame 300 can be replaced by the test dedicated boundary scan register.

On the other hand, when it is determined that the frame terminal Pi is not a test dedicated terminal (step S1307: No), a subsequent determination is made whether the terminal number i has reached the number of terminals n (in the case of FIG. 6, n=24), after the step S1306 or step S1309). When the terminal number i has not reached the number of terminals n (step S1310: No), the terminal number i is incremented by one (step S1311), and proceed to step S1304. On the other hand, when the terminal number i becomes i=n (step S1310: Yes), an automatic placement and an automatic wiring are performed (step S1312).

According to the embodiment, an optimum boundary scan register can be inserted at the time of layout, without using the test circuit synthesis tool. Further, a designer can insert an optimum boundary scan register without being aware of the type of the boundary scan register.

Moreover, according to the layout designing apparatus, the layout design method, and the layout design program, since the boundary scan register can be inserted in the layout design processing, it is not necessary for the designer to synthesize the test circuit for inserting the boundary scan register, at the stage of logic design, thereby the designing time can be reduced.

Furthermore, since the designer does not need to worry about the synthesis of the test circuit as represented by the boundary scan register, the time required for the logic design and the time for. understanding the processing procedure can be reduced. Further, at the stage of the layout design processing, it is not necessary to search placing position as before, which makes the connection short, based on the connection between the placed cells, and hence the placement area can be determined according to the number on the chip of the frame terminal through which the signal propagates and the type of the cell. Therefore, the processing for searching the optimum placing position is not required, thereby enabling efficient placing processing.

The layout design method explained in the embodiment can be realized by executing a prepared program in advance by a computer such as a personal computer and a workstation. The program is recorded on a computer readable recording medium such as a hard disk, a flexible disk, a CD-ROM, an MO, or a DVD, and read from the recording medium and realized by the computer. The program may also be a transmission medium that can be distributed via a network such as the Internet.

According to the layout designing apparatus, the layout design method, the layout design program, and the recording medium of the present invention, an optimum layout design can be efficiently obtained, thereby enabling a reduction in the designing time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A layout designing apparatus comprising:
an input unit that receives an input of a frame having a boundary scan register that propagates a test signal to an input/output macro placement area;
a placing unit that places an input/output macro to be connected to a signal terminal for propagating other signal than the test signal in an arbitrary input/output macro placement area of the frame input;
a determining unit that determines whether a frame terminal at an arbitrary terminal position in the frame matches with at least one of a test terminal for propagating the test signal in the frame input and a signal terminal to be connected to the input/output macro placed; and
a replacing unit that replaces, based on a result of determining by the determining unit, the input/output macro placed with either of a shared input/output macro to be connected to a shared terminal for propagating the test signal and the other signal and a test-only input/output macro propagating the test signal and having the boundary scan register.

2. The layout designing apparatus according to claim 1, wherein when the determining unit determines that the frame terminal at the arbitrary terminal position in the frame matches with the test terminal included in the frame input and the signal terminal to be connected to the input/output macro placed, the replacing unit replaces the input/output macro place with the shared input/output macro.

3. The layout designing apparatus according to claim 1, wherein when the determining unit determines that the frame terminal at the arbitrary terminal position in the frame matches only with the test terminal included in the frame input, the replacing unit replaces the input/output macro place with the test-only input/output macro.

4. The layout designing apparatus according to claim 1, wherein when the determining unit determines that the frame terminal at the arbitrary terminal position in the frame does not match with any one of the test terminal included in the frame input and the signal terminal connected to the input/output macro placed, the replacing unit does not perform replacement of the input/output macro placed.

5. A layout designing method comprising:
receiving an input of a frame having a boundary scan register that propagates a test signal to an input/output macro placement area;
placing an input/output macro to be connected to a signal terminal for propagating other signal than the test signal in an arbitrary input/output macro placement area of the frame input;
determining whether a frame terminal at an arbitrary terminal position in the frame matches with at least one of a test terminal for propagating the test signal in the frame input and a signal terminal to be connected to the input/output macro placed; and
replacing, based on a result of determining by the determining unit, the input/output macro placed with either of a shared input/output macro to be connected to a shared terminal for propagating the test signal and the other signal and a test-only input/output macro propagating the test signal and having the boundary scan register.

6. The layout designing method according to claim 5, wherein the replacing includes, when the determining determines that the frame terminal at the arbitrary terminal position in the frame matches with the test terminal included in the frame input and the signal terminal to be connected to the input/output macro placed, replacing the input/output macro place with the shared input/output macro.

7. The layout designing method according to claim 5, wherein the replacing includes, when the determining determines that the frame terminal at the arbitrary terminal position in the frame matches only with the test terminal included in the frame input, replacing the input/output macro place with the test-only input/output macro.

8. The layout designing method according to claim 5, wherein the replacing includes, when the determining determines that the frame terminal at the arbitrary terminal position in the frame does not match with any one of the test terminal included in the frame input and the signal terminal connected to the input/output macro placed, leaving the input/output macro placed without replacement.

9. A computer readable recording medium that stores a computer program for designing a layout, the computer program making a computer execute:
receiving an input of a frame having a boundary scan register that propagates a test signal to an input/output macro placement area;
placing an input/output macro to be connected to a signal terminal for propagating other signal than the test signal in an arbitrary input/output macro placement area of the frame input;
determining whether a frame terminal at an arbitrary terminal position in the frame matches with at least one of a test terminal for propagating the test signal in the frame input and a signal terminal to be connected to the input/output macro placed; and
replacing, based on a result of determining by the determining unit, the input/output macro placed with either of a shared input/output macro to be connected to a shared terminal for propagating the test signal and the other signal and a test-only input/output macro propagating the test signal and having the boundary scan register.

10. The computer readable recording medium according to claim 9, wherein the replacing includes, when the determining determines that the frame terminal at the arbitrary terminal position in the frame matches with the test terminal included in the frame input and the signal terminal to be connected to the input/output macro placed, replacing the input/output macro place with the shared input/output macro.

11. The computer readable recording medium according to claim 9, wherein the replacing includes, when the determining determines that the frame terminal at the arbitrary terminal position in the frame matches only with the test terminal included in the frame input, replacing the input/output macro place with the test-only input/output macro.

12. The computer readable recording medium according to claim 9, wherein the replacing includes, when the determining determines that the frame terminal at the arbitrary terminal position in the frame does not match with any one of the test terminal included in the frame input and the signal terminal connected to the input/output macro placed, leaving the input/output macro placed without replacement.

* * * * *